United States Patent

Shibuya et al.

[11] Patent Number: 5,841,128
[45] Date of Patent: Nov. 24, 1998

[54] OPTICAL SENSOR FOR READING A PATTERN

[75] Inventors: Yoshiki Shibuya; Takeo Ando; Mayumi Masui, all of Tokyo, Japan

[73] Assignee: Oki Electric Industry Co., Ltd., Tokyo, Japan

[21] Appl. No.: 822,922

[22] Filed: Mar. 21, 1997

[30] Foreign Application Priority Data

Jun. 26, 1996 [JP] Japan .................................. 8-165472

[51] Int. Cl.⁶ .......................... H01J 40/14; H01L 27/14
[52] U.S. Cl. ..................... 250/208.1; 250/216; 358/471
[58] Field of Search ............................. 250/208.1, 216; 358/471, 493, 494, 484

[56] References Cited

U.S. PATENT DOCUMENTS

| | | |
|---|---|---|
| 4,990,764 | 2/1991 | Yokochi et al. . |
| 5,130,761 | 7/1992 | Tanaka . |
| 5,357,099 | 10/1994 | Tabata et al. ........................ 250/208.1 |
| 5,399,850 | 3/1995 | Nagatami et al. ...................... 358/496 |
| 5,434,681 | 7/1995 | Imamura et al. ....................... 358/471 |
| 5,477,329 | 12/1995 | Imamura et al. ..................... 250/208.1 |
| 5,495,277 | 2/1996 | Imamura et al. ...................... 358/471 |
| 5,581,076 | 12/1996 | Tabata ................................. 250/208.1 |

FOREIGN PATENT DOCUMENTS

| | | |
|---|---|---|
| 0 243 089 A2 | 10/1987 | European Pat. Off. . |
| 0 619 608 A2 | 10/1994 | European Pat. Off. . |
| 2 264 002 | 8/1993 | United Kingdom . |

*Primary Examiner*—Stephone B. Allen
*Attorney, Agent, or Firm*—Rabin & Champagne, P.C.

[57] ABSTRACT

An optical read sensor includes a circuit board having light-emitting elements mounted thereon, a transparent cover on which an original to be read is placed, light-receiving elements, and a light-guide that guides the light reflected by the original to the light-receiving elements. The light-emitting elements emit light toward the original. The original reflects the light emitted from the light-emitting elements through the transparent cover. The light guide guides the light reflected by the original to the light-receiving elements.

23 Claims, 25 Drawing Sheets

CONVENTIONAL ART

OPTICAL SENSOR FOR READING A PATTERN

BACKGROUND OF THE INVENTION

1. Technical Field of the Invention

The present invention relates to an optical sensor for reading a pattern on an original.

2. Description of Related Art

FIGS. 76–78 illustrate a conventional optical sensor for reading a pattern from an original. Referring to FIG. 76, a glass cover 201 is placed on a frame 202. An original 210 to be read travels over the glass cover 201 in a direction shown by arrow Q. An LED board 207 is mounted obliquely in the frame 202. The LED board 207 has current limiting resistors, not shown, and LEDs 206 mounted thereon. Arranged at the bottom of the frame is a photodetector board 204 on which photodetectors 205 are mounted. A SELFOC lens array (referred to as SLA hereinafter) 203 is mounted between the glass cover 201 and photodetector board 204. "SELFOC lens" is a trade name. The SELFOC lens array is formed of a plurality of optical fibers arranged in parallel in a row. Each of the optical fibers has a focal point on the light incidence side and another focal point on the light exiting side. The SLA 203, photodetector board 204, and LED board 207 extend in directions perpendicular to the page of FIG. 76.

The light 206a emitted from the LEDs 206 illuminates the original 210 on which a pattern is printed. The light 206a is randomly reflected by the original 210 and some of the reflected light passes through the glass cover 201 and SLA 203 to the photodetectors 205 which detect the pattern printed on the original 210. FIG. 77 is a fragmentary perspective view of the SLA 203 and FIG. 78 is a cross-sectional view thereof showing focal points f1 and f2. The SLA 203 is of the construction in which a plurality of optical fibers 208 are aligned in array form integrally assembled in resin body 209. The SLA 203 has a focal point f1 on its light incident side and a focal point f2 on its light-emerging side, the two focal points being spaced apart by a distance Tc. The focal points f1 and f2 of the SLA 203 are symmetrical with respect to the center line C–C' but may shift, after the SLA 203 is assembled into the sensor, if the optical path includes a component(s) made of a material such as plastics or glass having a refractive index different than that of air. The diameter of the optical fibers 208 determines the resolution of the SLA 203, which in turn determines the minimum thickness of lines and minimum size of a black-and-white pattern that can be read from the original.

The photodetector 205 is a line sensor in which light-receiving areas are aligned at, for example, intervals of 1 dot/mm, 2 dot/mm, 8 dot/mm, or 16 dot/mm. The total length of the row of the photodetectors 205 determines the width of a pattern that can be read from the original 210.

The information on an original is read on a line-by-line basis and therefore each line must be illuminated by the light having the same intensity across the line. In order that the outputs of the photodetectors correctly represent black and white levels of the original, the same amount of light must illuminate across the area on the original being read and the photodetectors must receive only the light reflected by the original. However, with the aforementioned prior art read sensor, some of the light 206a emitted from the LEDs 206 may leak through the LED board into the photodetectors 205 or may illuminate the surroundings of the photodetectors 205 so that the light reflected by the surroundings enters the photodetectors 205. Such unwanted light causes the outputs of the photodetectors 205 to increase, resulting in a smaller difference between the white level and black level. In other words, unwanted light results in a poor signal to noise ratio of the output of the sensor 210, hence a smaller dynamic range of the sensor output.

A poor signal to noise ratio of the output of the photodetector 205 causes different sensor outputs depending on locations on the line being read when reading an original having the same reflectivity across the line.

The desired overall resolution of data cannot be obtained if the LEDs 206 are not properly oriented to emit light in the right direction and/or the SLA 203 and photoreceptor 205 are not assembled exactly at the designed locations. In addition, the read sensor is subjected to a considerable amount of vibration when the apparatus is actually operated and therefore the LEDs 206, SLA 203, and photodetectors 205 must be securely mounted so that the vibration does not change their relative positions. Conventionally, the LEDs 206, SLA 203 and photodetectors 205 are fixed by an adhesive. However, adhesion is not sufficient to accurately and securely mount the LEDs 206, SLA 203, and photodetectors 205.

SUMMARY OF THE INVENTION

An object of the present invention is to provide a read sensor for optically reading a pattern on the original, the read sensor offering a desired resolution and having an improved mechanical strength.

An optical read sensor according to the invention includes an LED board having light-emitting elements mounted thereon, transparent cover on which an original to be read is placed, light-receiving elements, and light-guide that guides the light reflected by the original to the light-receiving elements.

The light-emitting elements emit light toward the original. The original reflects the light emitted from the light-emitting elements through the transparent cover. The light guide directs the light reflected by the original to the light-receiving elements. The light-receiving elements receive the light reflected by the original through the transparent cover.

Leakage of the light emitted from the light-emitting elements is minimized by the bonding pads extending over substantially the entire LED board. The smaller size of the LED board can be accomplished by forming wire patterns on the back side of the LED board, and current limiting resistors for limiting currents through the light-emitting elements are mounted on the wire patterns.

The bonding pad may be formed to have a wire bonding pad and a die bonding pad connected by a narrow conductor path.

The light receiving element has a light-blocking area which surrounds light-receiving areas. The light-blocking area is of an uneven surface structure so that the light-blocking layer firmly holds the semiconductor substrate. The light receiving element may have carrier absorbing electrodes formed between adjacent light-receiving areas.

In order to obtain light having a uniform distribution of the amount of light, the light emitting elements may be arranged at a variety of intervals. The light may be collimated by a lens or reflected by a reflector mounted on the LED board toward the original to be read.

The case may be formed with a groove in which an adhesive is held between the light guide and the case, thereby firmly holding the light guide in position. The case may also be formed with through-holes through which an adhesive is introduced into the interface between the light guide and case. Upper and lower hooks may be formed on the wall of the case. The light guide is held in position by the hooks and engaged with projections that press the light guide against the wall.

The case may have projections with which the circuit board is mounted to the case, thereby firmly positioning the circuit board.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Preferred embodiments of the invention will be described in detail with reference to the drawings.

First embodiment

Figure 1:
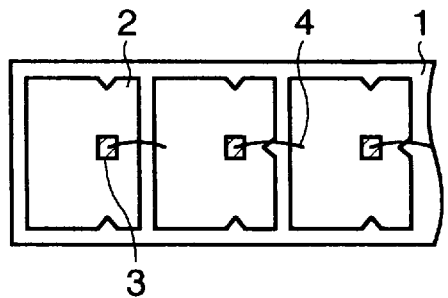
FIG. 1 is a top view of a first embodiment.

FIG. 1 is a fragmentary top view of a light emitting section of an optical read sensor of a first embodiment. Referring to FIG. 1, the LED board 1 is in the form of a glass epoxy circuit board. The die bonding pads 2 are formed on an LED board 1 by plating copper patterns with gold and have notches that facilitate positioning of the LED chips 3 thereon. When the LED chip is to be mounted at a location other than the central area of the bonding pad 2, the notches effectively indicate an exact location on the bonding pad 2 where the LED chip 3 is to be mounted. The LED chips 3 are die-bonded to the die bonding pads 2. In this embodiment, the die bonding pads also serve as wire bonding pads. Each LED chip is electrically connected to the die bonding pad 2 of the adjacent LED chip by means of gold wire bond 4, so that the LED chips are connected in series. The die bonding pad 2 extends over as large an area as possible on the LED board 1. The die bonding pads 2 are formed on the LED board 1 by gold-plating during the manufacture of the LED board 1, and therefore the distance between the die bonding pads 2 is usually selected to be in the range of 0.3–0.4 millimeters. The die bonding pads 2 may extend transversely of the LED board 1, to cover almost the full width of the LED board 1, as long as the die bonding pads 2 are not short-circuited to each other.

A large surface area of the die bonding pad 2 is effective in preventing a large portion of the light emitted from the LEDs from transmitting through the LED board 1. The surfaces of the gold-plated die bonding pads 2 serve to effectively reflect the light emitted from the LEDs, increasing the total amount of light which reaches the original.

Thus, the first embodiment prevents the leaked light from entering the photodetectors, thereby solving the problem that the leaked light increases the output of the photodetectors when the photodetectors are reading black patterns.

Second embodiment

Figure 2:
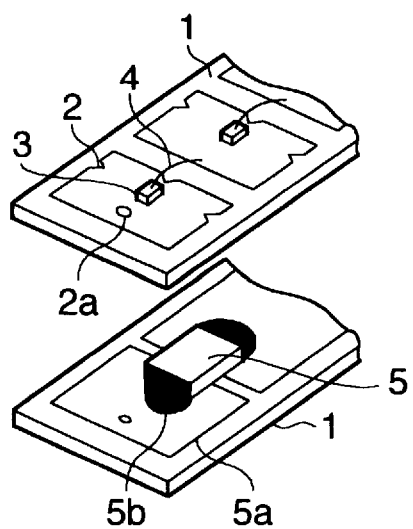
FIGS. 2–4 illustrate a second embodiment.
Figure 3:
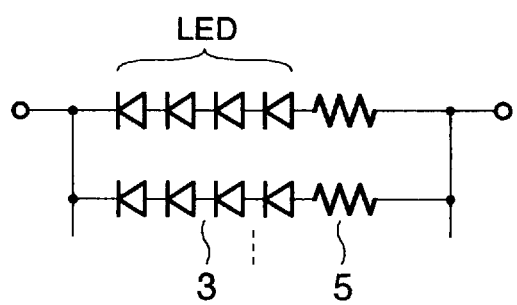
Figure 4:
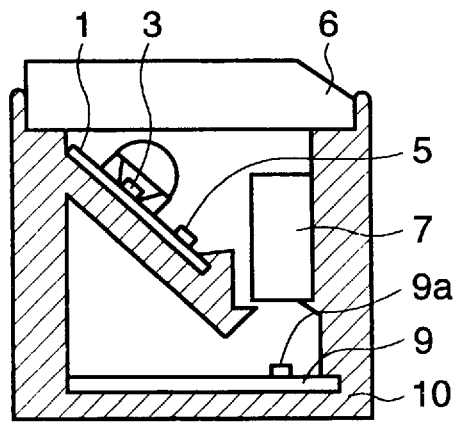

FIGS. 2–4 illustrate a second embodiment of an optical read sensor. The second embodiment is characterized in that current limiting resistors are mounted on an LED board 1. FIG. 2 shows the front side of the LED board 1 on which LED chips 3 are mounted and the back side on which current limiting resistors 5 (chip type resistors) are mounted. FIG. 3 shows an electrical equivalent circuit of FIG. 2.

The LED board 1 takes the form of a glass epoxy board and has die bonding pads 2 on the front side thereof connected via a through-hole 2a with wire patterns 5b. The LED chips 3 are bonded on the die bonding pads 2.

As shown in FIG. 3, the LED chips 3 are wired in series with the current limiting resistor 5 and the series circuits are then connected in parallel. The current limiting resistor 5 may be of a lead type, in which case holes must be made for inserting the leads of the resistor through the LED board 1 and therefore the mounting location of the resistor 5 should be carefully selected so that the leads are not short-circuited to the other die bond pads 2. The LED chips 3 and current limiting resistors may be mounted on the same side of the LED substrate 1, in which case the LED board 1 should be wider than that shown in FIG. 2.

FIG. 4 is a cross-sectional view of the sensor when assembled into a frame 10, showing the LED board 1. In this case, the LED chips 3 and current limiting resistors 5 are mounted on the same side of the LED board 1. A glass cover 6 on which an original to be read is placed is assembled on the top of the frame 10. Photodetector board 9 is disposed on the bottom of the frame 10. Disposed between the glass cover 6 and the photodetector board 9 is an SLA 7. The SLA 7, LED board 1, and photodetector board 9 extend in directions perpendicular to the page of FIG. 4. While the LED chips 3 and the current limiting resistors 5 are mounted on the same side of the LED board 1, the current limiting resistors 5 may be mounted on the other side so that the LED board 1 can be smaller in width. A smaller width of the LED board 1 is advantageous in miniaturizing the sensor.

The total thickness of the gold-plated pad patterns is only about several microns and the thickness of the gold is less than a micron. Therefore, some amount of light emitted from the LED chips 3 still leaks therethrough. Thus, the pad pattern 2 may also be provided on the other side of the LED board 1 to considerably increase the light-blocking effect. The pad patterns on the both sides of the LED board 1 are gold-plated.

Third embodiment

While the die bonding pads 2 extending over substantially the entire surface of the LED board 1 reflect a large portion of the light emitted from the LEDs to the original, some of the light leaks through the die bonding pads 2 since the die bonding pads 2 are only several microns thick.

Figure 5:
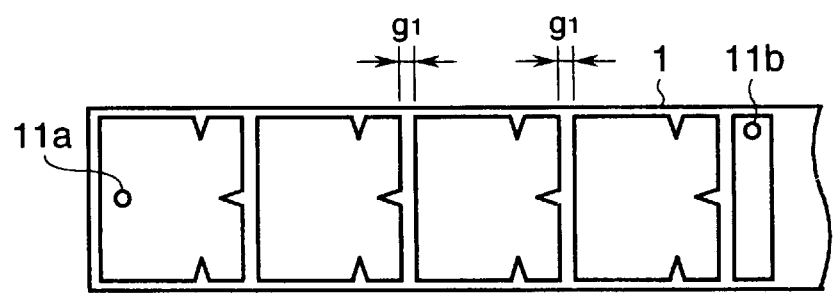
FIGS. 5–6 illustrate a third embodiment.

Referring to FIG. 5, wiring patterns 11 are formed on the back side of the LED board 1. Current limiting resistors 5 are mounted bridging the two adjacent wiring patterns 11, and soldered at 5a to the patterns as shown in FIG. 6.

Figure 6:
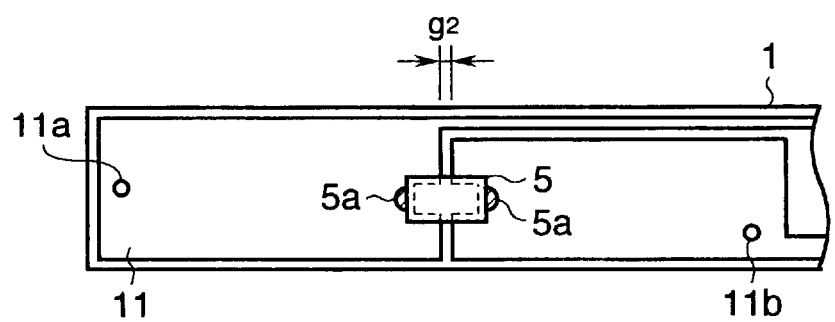

The die bonding pads 2 on the front side of the LED board 1 extend over substantially the entire surface of the LED board 1 as shown in FIG. 5, and the wiring patterns 11 on the back side also extend substantially over the surface of the LED board 1 as shown in FIG. 6. The die bonding pads 2 and the wiring patterns 11 are arranged in a staggered relation so that the gap g1 between the die bonding pads 2 do not overlap the gap g2 between the wiring patterns 11. In this manner, the front side-to-back side leakage of light can be minimized.

Providing the die bonding pads 2 on one side of the LED board 1 and patterns of a shape similar to that of the die bonding pads 2 on the other side and arranging the patterns in staggered form are advantageous in that light-blocking effect is improved by a factor of about two as compared to providing light-blocking patterns only on one side of the LED board 1, further improving the signal to noise ratio of the output of the read sensor.

Fourth embodiment

A fourth embodiment is directed to the shapes of the die bonding pad and wire bonding pad used for an optical read sensor.

Figure 7:
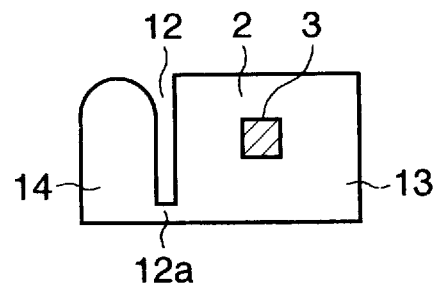
FIGS. 7–10 illustrate a fourth embodiment.

FIGS. 7–10 illustrate bonding pads, each of which includes a die bonding pad and a wire bonding pad formed on the same side of the LED board. Referring to FIG. 7, a groove 12 is formed to extend so as to define a wire bonding pad 14 and a die bonding pad 13 connected via a narrow connection 12a. The width of the groove 12 is in the range of from 0.3 to 0.4 millimeters, depending on the etching accuracy. The width of the connection 12a also usually ranges from 0.3 to 0.4 millimeters. The narrow connection 12a effectively prevents the bonding paste applied to the die bonding pad 13 from spreading into the wire bonding pad 14.

Figure 8:
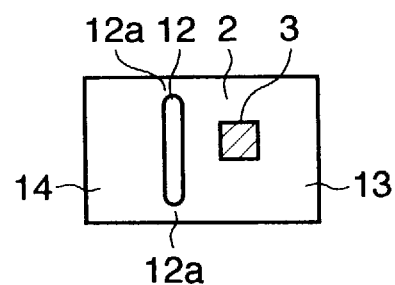
Figure 9:
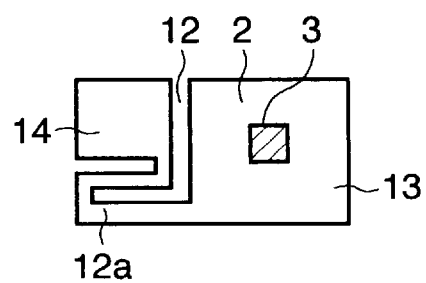

FIG. 8 illustrates the die bonding pad 13 and wire bonding pad 14 connected together via two connections 12a. FIG. 9 illustrates the die bonding pad 13 and wire bonding pad 14 connected via a long connection 12a, in which case a size of 100 μm square is sufficient for the wire bonding pad 14. The long, narrow connection 12a effectively prevents the bonding paste from spreading into the wire bonding pad 14.

The silver paste used in bonding the LED chip 3 to the die bonding pad 2 contains a solvent and a resin in liquid phase. The solvent and resin in liquid phase applied to the bonding pads 2 spread between the particles of gold on the gold-plated pad due to capillary phenomenon, decreasing bonding strength. Defining the die bonding pad 2 and wire bonding pad 14 by using the groove 12 substantially isolates the two pads one from the other, preventing the solvent from spreading into the area of the wire bonding pad 14. The long connection 12a as shown in FIG. 9 further improves the isolation effect.

Figure 10:
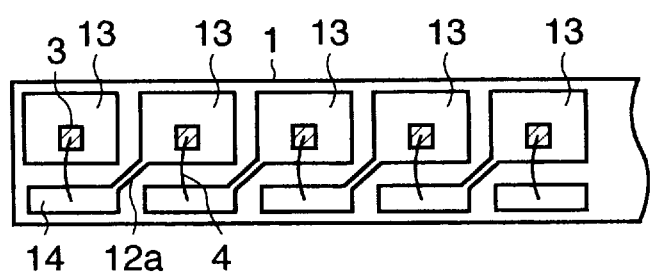

The wire bond pads 14 may be arranged laterally of the bonding pads 2 as shown in FIG. 10 and connected via connection 12a to the corresponding bonding pads.

Fifth embodiment

Figure 11:
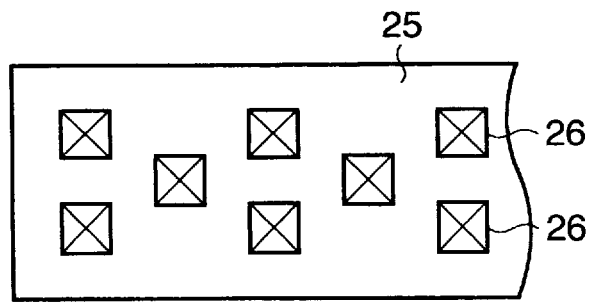
FIGS. 11–13 illustrate a fifth embodiment.
Figure 12:
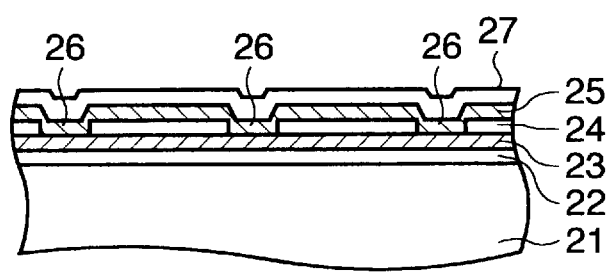
Figure 13:
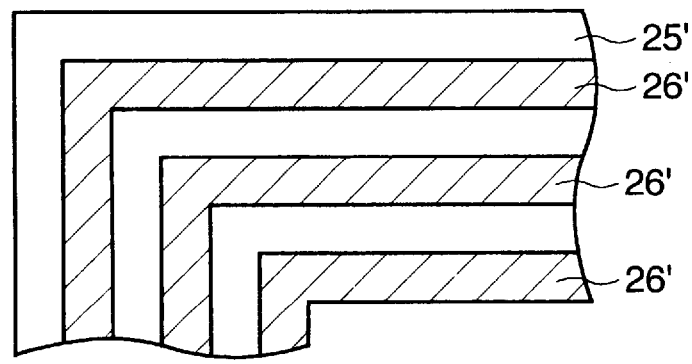

FIGS. 11–13 illustrate a fifth embodiment directed to a construction of a photodetector. The photodetector includes light receiving areas surrounded a non-light receiving area. In the fifth embodiment, the photodetector has two aluminum layers that serve to block light from reaching the non-light receiving area.

FIGS. 11–13 are fragmentary views of the non light-receiving area formed in the photodetector. A silicon substrate 21 has an interlayer dielectric 22 formed thereon. Formed on the interlayer dielectric 22 is a first aluminum layer 23 for the purposes of wiring and blocking light. Another interlayer dielectric 24 is formed on the first aluminum layer 23. Then, a second aluminum layer 25 is formed on the interlayer dielectric 24, the second aluminum layer 25 extending over a large area as shown in FIG. 11 for blocking the incident light. The first aluminum layer 23 is electrically connected to the second aluminum layer 25. Through-holes 26 are formed in the second aluminum layer 25 and a protecting film 27 is formed on the top of the second aluminum layer 25. The through-holes 26 are arranged in a checkboard pattern as shown in FIG. 11.

The through-holes 26 may be arranged in patterns different from the checkboard pattern as long as they are disposed at 10–30 μm intervals. The interlayer dielectric 22 and 24 are the same as that usually formed during the element forming process in the manufacture of C-MOSs and bipolar transistors. The shape of the through-holes 26 is not limited to a square but can be of other shapes, such as a rectangle. The through-holes may be arranged alternately with the second aluminum layer 25' and may extend straight as indicated at 26' in FIG. 13.

If the through-holes 26 are not formed, the second aluminum layer 25 is flat and is simply deposited on the interlayer dielectric (oxide). Therefore, the second aluminum layer 25 may come off the interlayer dielectric due to laterally exerted forces, for example, when a resin is applied for sealing against the environment. Through-holes are very effective in that the second layer of aluminum projects into the through-holes to firmly hold the interlayer dielectric 24. This construction permits the second aluminum layer 25 to resist a laterally exerted force that tends to peel off or slide the second aluminum layer 25.

Sixth embodiment

FIGS. 14–17 illustrate a sixth embodiment directed to a construction of a photodetector. The sixth embodiment differs from the fifth embodiment in that contact holes 34 are formed in the first interlayer dielectric 32 in addition to the through-holes. Reference numeral 35 denotes an interlayer dielectric and reference numeral 38 denotes a protective layer. The contact holes 34 are also arranged in a similar manner to the through-holes 26 in the fifth embodiment. The sizes of the contact holes 34 and through-holes 37 are, for example, 10 μm square in this embodiment, but are not important. The contact holes 34 and through-holes 37 should preferably be densely arranged for sufficient mechanical strength.

Figure 14:
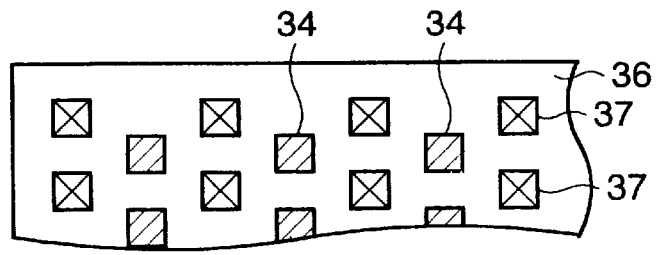
FIGS. 14–17 illustrate a sixth embodiment.
Figure 16:
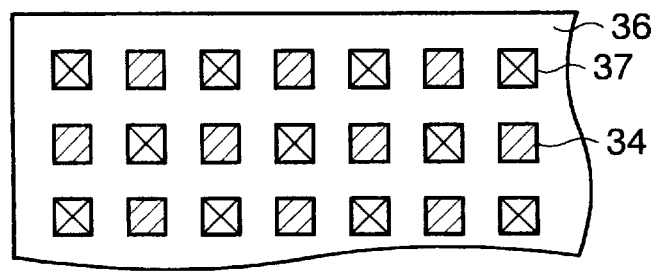
Figure 17:
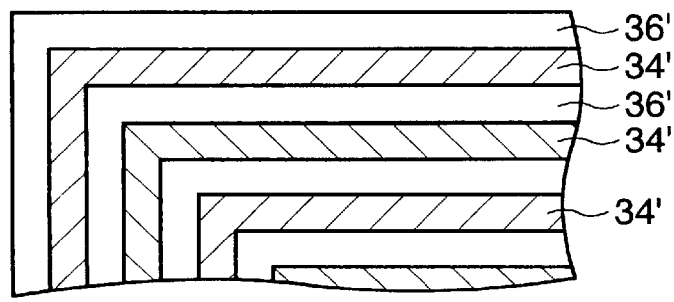

FIG. 14 illustrates an example of the arrangement of the contact holes 34 and through-holes 37 where the through-holes 37 are aligned in a row and the contact holes 34 are aligned in an adjacent row, each contact hole 34 being between located the through-holes 37 in the adjacent row. FIG. 16 illustrates another example of the arrangement where the through-holes 37 are disposed alternately with the contact holes 34 in each row, the contact holes 34 being adjacent to the through-holes 37 in the adjacent row. The shapes of the through-holes 37 and contact holes 34 are not limited to a square but may be, for example, a rectangle. The contact holes 34 may extend straight as indicated at 34' in FIG. 17. The reference numeral 36' denotes a second aluminum layer and is electrically connected to the first aluminum layer 33.

Figure 15:
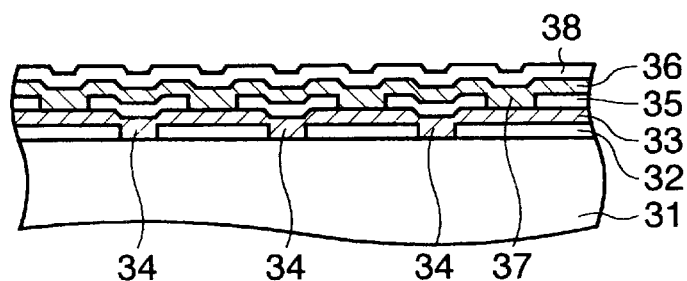

Forming the contact holes 34 in the first aluminum layer 33 increases "holding effect" as shown in FIG. 15, so that the first aluminum layer 33 firmly holds the substrate, resisting laterally exerted forces that tend to peel off or slide the first aluminum layer. Thus, the holding effect of the first aluminum layer 33 allows the second aluminum layer 36 to further resist laterally exerted forces.

Seventh embodiment

Figure 18:
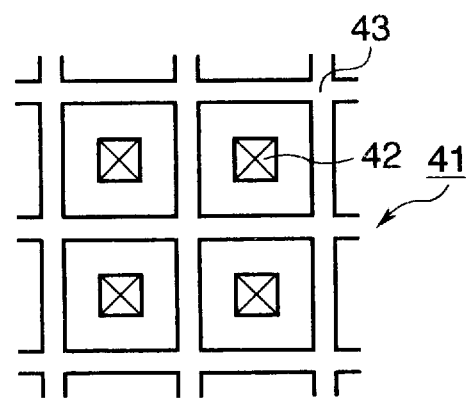
FIGS. 18–19 illustrate a seventh embodiment.
Figure 19:
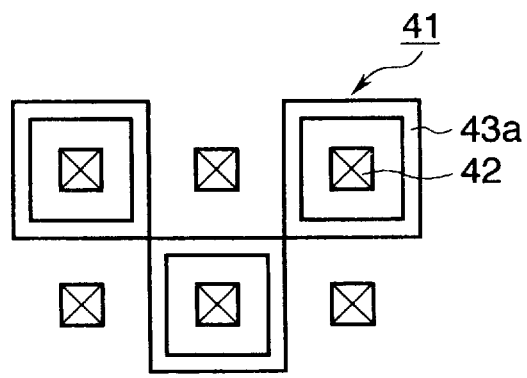

FIGS. 18–19 illustrate a seventh embodiment directed to a construction of a photodetector.

Referring to FIG. 18, a polysilicon layer 43 is formed around contact holes 42 in a carrier-absorbing area of a photodetector 41. This polysilicon layer 43 is usually formed during the gate-forming process of the C-MOS semiconductor manufacturing process. While the contact holes 42 are surrounded by the continuous polysilicon layer 43, the contact holes 42 may be surrounded by separate polysilicon layers 43a as shown in FIG. 19.

The light-receiving areas occupy most of the chip area, and the signal processing circuit uses only 10 to 20% of the total area. Therefore, the pattern ratio of polysilicon, i.e., the ratio of the area occupied by the polysilicon to the total chip area, is extremely small, with the result that the chips (wafer) are not processed reliably and their characteristics vary from chip to chip if the chips are manufactured through a wafer process in which IC chips having ordinary signal processing circuits are manufactured.

Inserting a polysilicon layer into a space between the light receiving areas increases the pattern ratio of polysilicon to the total chip area, ensuring the reliable processing of the wafer. Arranging the polysilicon layer to surround the contact holes or through-holes causes uneven shapes similar to those shown in FIG. 15. Such uneven shapes allow the first and second aluminum layers formed over a large area for the purpose of light-blocking to firmly hold the layer thereunder, the aluminum layers withstanding forces that tend to laterally slide or peel off the aluminum layers.

Eighth embodiment

Figure 20:
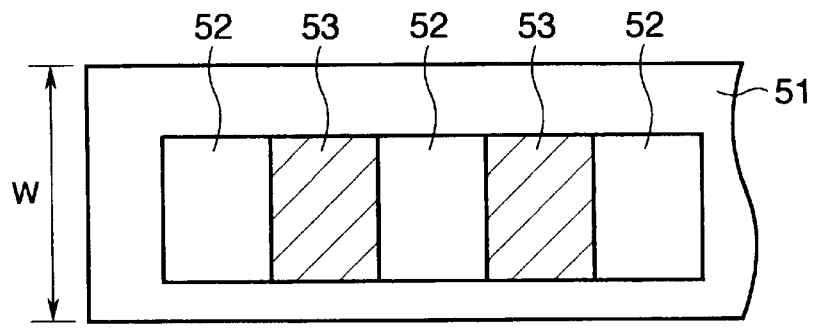
FIGS. 20–24 illustrate an eighth embodiment.
Figure 21:
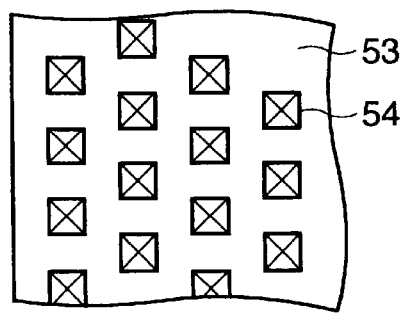
Figure 22:
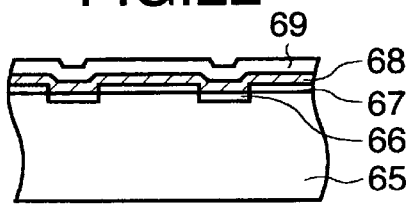

FIGS. 20–24 illustrate an eighth embodiment directed to a construction of a photodetector. Referring to FIG. 20, the light-receiving chip 51 is about W=1.5 mm wide and has light-receiving areas 52 aligned longitudinally thereof. Arranged between the adjacent light-receiving areas 52 are carrier-absorbing areas 53 in which contact holes 54 are formed as shown in FIG. 21. The carrier-absorbing areas 53 do not contribute to the output of the light-receiving chips 51. As shown in FIG. 22, a diffusion layer 66 is formed in the carrier-absorbing area 53 and contact holes 54 are formed in an interlayer dielectric 67 over the diffusion layer 66. The shape of the diffusion layer 66 is not limited to a square and may be other shapes, such as a rectangle or even a straight belt-like shape. An aluminum layer 68 is formed on the interlayer dielectric 67, filling the contact holes 54. The aluminum layer 68 is connected to the potential of a power supply or ground. The aluminum layer 68 is covered with a protective layer 69 that protects the photodetector from the environment.

Figure 23:
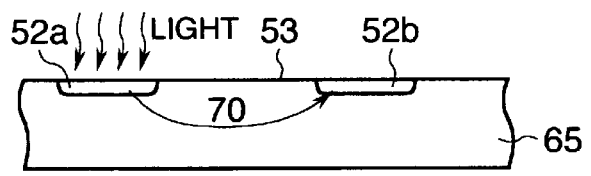

If the contact holes 54 are not formed in the carrier absorbing areas 53, the photodetector operates as follows: Referring to FIG. 23, when light impinges the light-receiving area 52a, carriers are generated in the light-receiving area 52a. A majority of the generated carriers is absorbed through the electrode, not shown, connected to the light-receiving area 52a, becoming a photocurrent. However, some 70 of the carriers migrate to the adjacent light-receiving area 52b on which no light impinges, and are absorbed through the electrode of this adjacent light-receiving area 52b. As a result, a photocurrent flows through the electrode of the adjacent light-receiving area 52b even though no light is incident upon the adjacent light-receiving area 52b.

Figure 24:
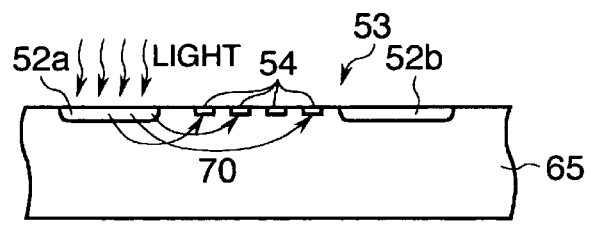

If the contact holes 54 are formed between the adjacent light-receiving areas 52a and 52b, the contact holes 54 serve to absorb carriers migrating from one light-receiving area 52a to the other 52b before the carriers reach the adjacent light-receiving area 52b as shown in FIG. 24, thereby preventing the carriers from reaching the adjacent light-receiving area 52b. This carrier-absorbing effect eliminates an unwanted output of the light-receiving area 52b when light is not incident thereon, maintaining a sufficiently lower, dark level of the output.

Ninth embodiment

A ninth embodiment is directed to the arrangement of the light-emitting elements.

Figure 25:
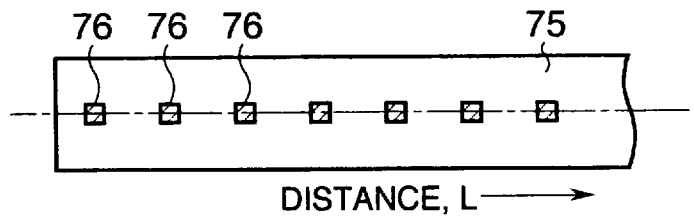
FIGS. 25–28 illustrate a ninth embodiment.
Figure 26:
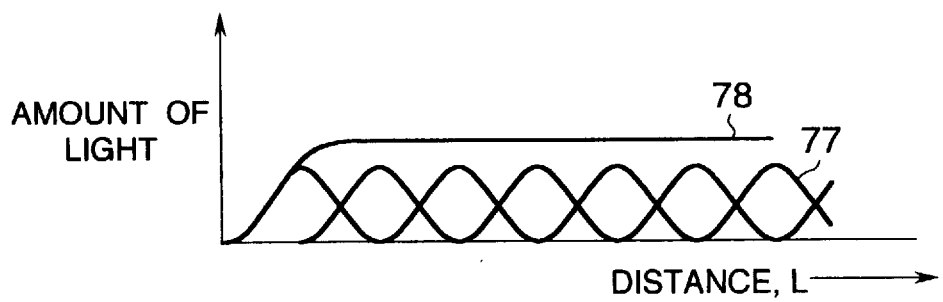

FIG. 25 illustrates all the LED chips 76 arranged at 3 mm intervals on an LED board 75. FIG. 26 illustrates the distribution of the amount of light emitted from the LED chips 76. The distribution is plotted along the LED board 75, curve 77 representing the amount of light emitted from each LED chip and curve 78 showing the overall distribution of the amount of light.

It is to be noted that the curve 78 falls below the flat part near the leftmost LED chip as shown in FIG. 26.

Figure 27:
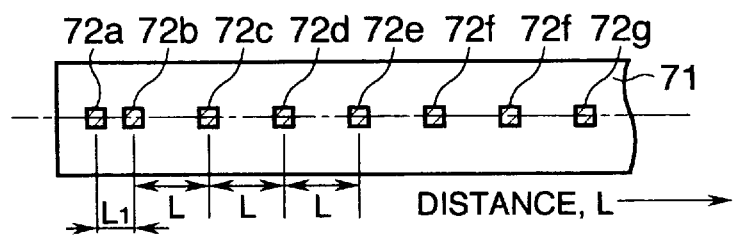
Figure 28:
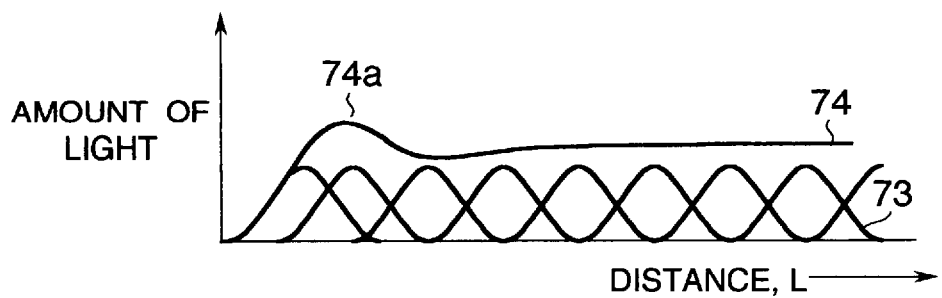

FIG. 27 illustrates LED chips 72a, 72b, and 72 arranged longitudinally of along an LED board 71, and FIG. 28 illustrates the distribution of the light emitted from the light-emitting elements. The distribution is plotted along the LED board 71, curve 73 representing the distribution of the amount of light emitted from the respective LED chips and curve 74 showing the overall distribution.

Referring to FIG. 27, the LED chips 72b–72g are all arranged at predetermined intervals L but the LED chip 72a and the LED chip 72b are spaced apart a shorter distance L1 than the other LED chips. In the embodiment, the LED chips 72a and 72b are 1.7 mm apart and the other LED chips are 3 mm apart.

More than two chips may be arranged closer than the other chips depending on a desired contour of the distribution 74 of the amount of emitted light, especially the "shoulder" of the distribution curve 74. If the LED chips are arranged still closer at the end of the arrangement, the shoulder of the distribution curve becomes steeper.

Tenth embodiment

A tenth embodiment is directed to the arrangement of the light-emitting elements.

Figure 29:
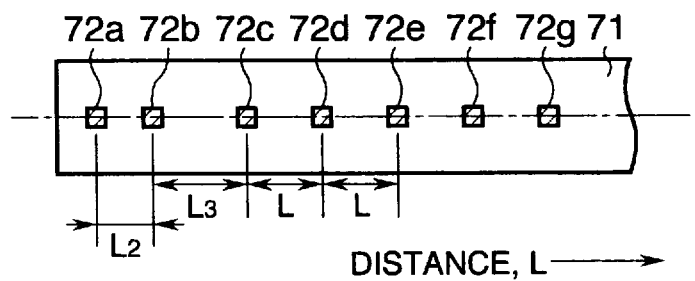
FIGS. 29–31 illustrate a tenth embodiment.
Figure 30:
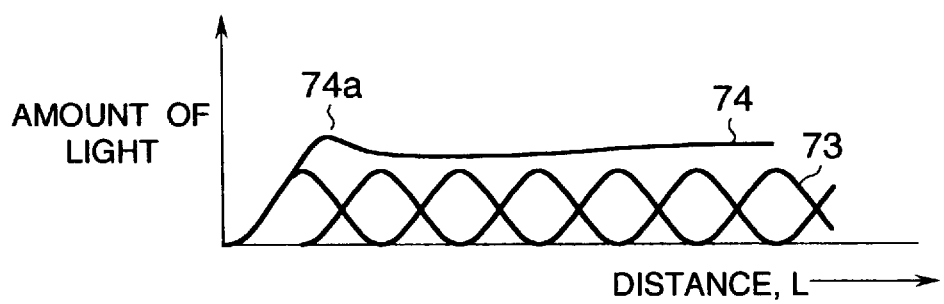

FIG. 29 illustrates LED chips arranged longitudinally of along an LED board 71, and FIG. 30 illustrates the distribution of the amount of light emitted from the LED chips 72a–72g, the distribution being plotted along the LED board 71.

Referring back to FIGS. 27 and 28, arranging the LED chip 72a closer to the LED chip 72b improves the flatness of curve 74 near its shoulder but results in a hump 74a. This is due to the fact that the light emitted from the first through fourth LEDs 72a–72d is added together. The skirt of the hump 74a reaches over the third LED chip 72c.

In the tenth embodiment, as shown in FIG. 29, the LED chips disposed closer to the center of the LED board 71 than the LED chip 72c are spaced apart by a predetermined distance L, while the first and second LEDs 72a and 72b are spaced apart by a distance L2 shorter than the predetermined distance L, and the second and third LEDs 72b and 72c are spaced apart by a distance L3 longer than the predetermined distance L.

Specifically, the distances L2, L3, and L are 1.7 mm, 5 mm, and 3 mm, respectively.

Figure 31:
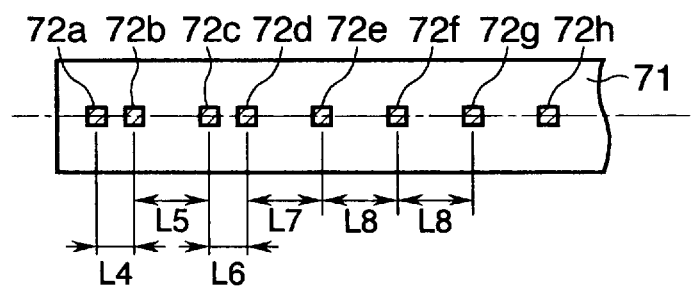

Alternatively, the LED chips may be arranged as shown in FIG. 31. The first and second LED chips 72a and 72b are spaced apart by a distance L4 and the third and fourth LED chips 72c and 72d are spaced apart by a distance L5, L4 and L5 being sufficiently shorter than the distance L (equal pitch). The second and third LED chips 72b and 72c are spaced apart by a distance L5 that is slightly shorter than the distance L. The fourth and fifth LED chips 72d and 72e are spaced apart by a distance L7 that is longer than the distance L.

In the tenth embodiment, the distances L4 and L6 are 1.7 mm, and the distances L5, L7, and L8 are 3, 5, and 4 mm, respectively. Curve 74 shown in FIG. 30 loses its flat part by the amount of the hump 74a, which is determined by the resultant distribution of light emitted from the equally spaced LED chips and the LED chips more closely spaced than the equally spaced LED chips. The hump 74a of curve 74 may be reduced by arranging the LED chips such that the group of the closely located LED chips are away from the group of the equally spaced LED chips, by a distance longer than the interval of equally spaced LED chips. Further, the drive currents of the LED chips may be varied such that the closely arranged LED chips are supplied with less current than the LED chips arranged at the predetermined intervals, thereby providing substantially flat overall distribution of light.

Eleventh embodiment

Figure 32:
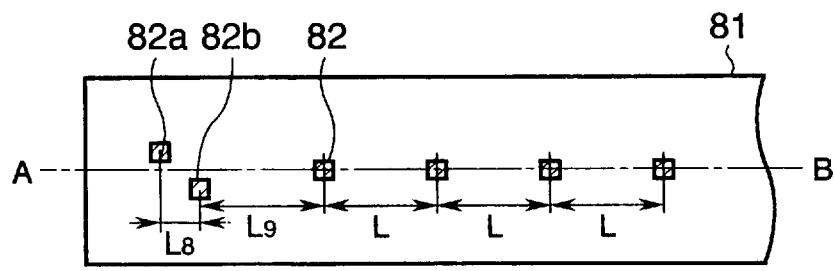
FIGS. 32–34 illustrate an eleventh embodiment.

An eleventh embodiment is also directed to the arrangement of light emitting elements. In the eleventh embodiment, some LED chips near the longitudinal end of the LED board are not aligned with the rest of the LED chips. Referring to FIG. 32, LED chips 82a, 82b, and 82 are die-bonded on a glass epoxy board 81. The two LED chips 82a and 82b are obliquely arranged and offset from the center line A–B, the chip 82a being on one side of the line A–B and the chip 82b on the other. The LED chips 82a and 82b are, for example, a distance less than 1 mm away from the line A–B. The distance L8 between the LED chips 82a and 82b is shorter than the distance L, and the distance L9 between the LED chips 82b and the third chip 82 is longer than the distance L.

Figure 33:
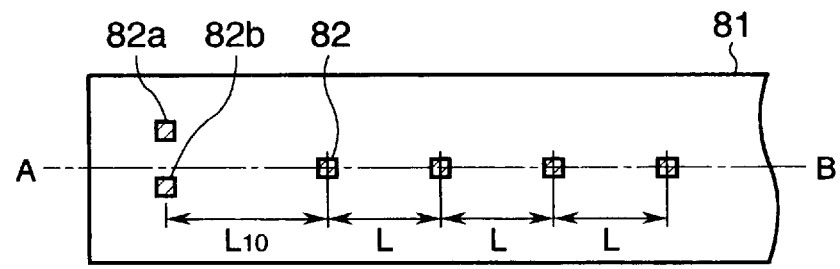

Alternatively, the LED chips 82a and 82b may be disposed oppositely across the line A–B as shown in FIG. 33.

While only two irregularly arranged LED chips 82a and 82b are illustrated in FIGS. 32 and 33, a larger number of LED chips may be arranged in a similar manner. Groups of a different number of LED chips may be differently arranged at different locations as shown in FIG. 34, the LED chips being differently spaced apart both longitudinally and laterally of the LED board 81.

Figure 34:
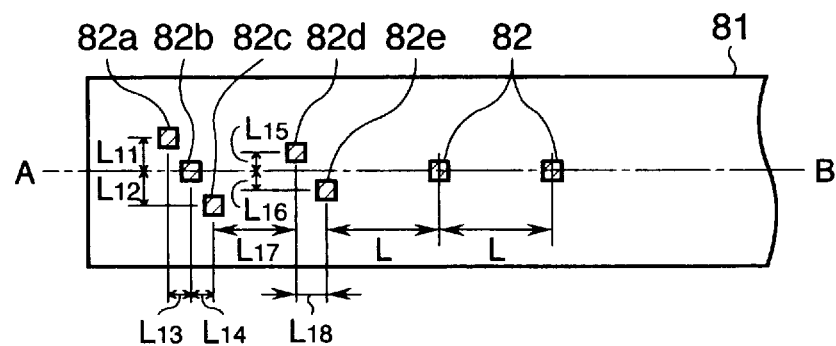

Referring to FIG. 34, the LED chip 82b is on the center line A–B. The LED chips 82a and 82c are offset from the center line A–B by distances L11 and L12, respectively, and longitudinally away from the LED chip 82b by distances L13 and L14, respectively. The LED chips 82c and 82d are spaced apart by a distance L17 longitudinally of the LED board 81. The chips 82d–82e are offset from the center line A–B by distances L15 and L16, respectively, and are spaced apart longitudinally by a distance L18.

As described above, arranging more LED chips in proximity to the end of the LED board 81 increases the flat part of the overall distribution of the amount of light emitted from the LED chips. Therefore, the eleventh embodiment solves the problem shown in FIG. 28 that if the LED chips are equally spaced, the overall distribution of the amount of light emitted from the LED chips decreases below its flat part toward the end of the LED board 81.

Twelfth embodiment

Figure 35:
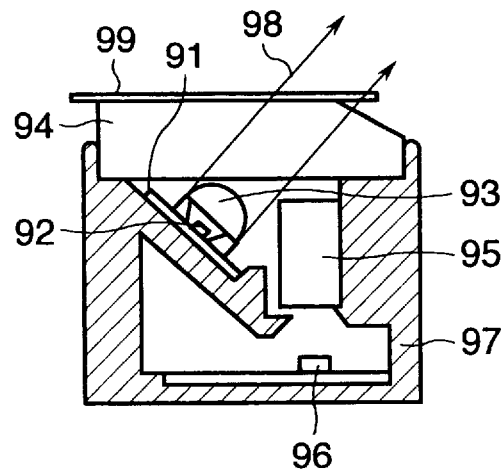
FIGS. 35–37 illustrate a twelfth embodiment.
Figure 36:
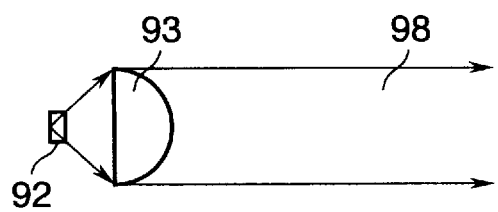

A twelfth embodiment is directed to means (lens 93) for guiding the light emitted from LED chips toward an original to be read. FIG. 35 illustrates a construction of an optical read sensor.

Referring to FIG. 35, an LED board 91 is mounted obliquely in a case 97 and has LED chips 92 mounted thereon. A lens 93 is obliquely mounted above the LED chip 92 and directs the light emitted from the LED chip 92 toward an original placed on a glass cover 94. The lens 93 is a lens that has no focal point on the downstream side thereof and converts the light emitted from the LED chips 92 into a beam 98 of substantially parallel light. The lens 93 is formed of a transparent resin and has an aspherical surface so that the lens 93 has a negligible aberration and caustic curves.

The lens 93 projects a beam of light that crosses center line K–K' of the SLA 95 at a point $\underline{P}$ above the glass cover 94. The point is a distance $L_{opt}$ above the original 99 placed on the glass cover 94. The lens 93 is very effective in collimating the light from a light source. For example, the light through the lens 93 illuminates white paper placed on the top surface of the glass 94 and the light is reflected by the paper to a photodetector 96. The output of the photodetector 96 is about more than twice that when the lens 93 is not used. In addition, due to the fact that the lens 93 has no focal point downstream thereof, the beam 98 of light has a substantially uniform distribution of intensity in an area directly above the SLA 95, i.e., an area in which the original is to be read.

Figure 37:
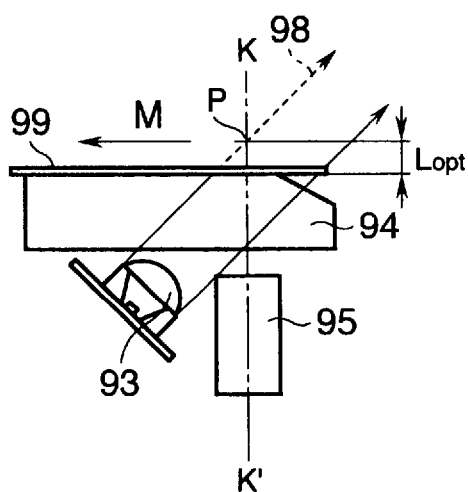

As shown in FIG. 37, as the original 99 travels on the top surface of the glass 94, the light is reflected by the original 99. The reflected light passes through the SLA 95 and is incident upon the photodetector 96. The original 99 travels forward in a direction shown by arrow M while moving up and down slightly. Therefore, if the distance $L_{opt}$ is somewhat wider than the maximum vertical movement of the original 99, the amount of reflected light remains substantially the same regardless of the vertical movement of the original 99.

Thirteenth embodiment

Figure 38:
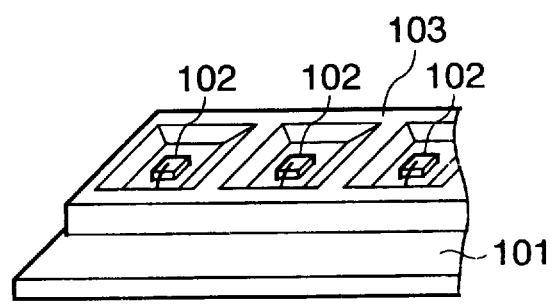
FIGS. 38–39 illustrate a thirteenth embodiment.

A thirteenth embodiment is directed to a construction of a reflector used in combination with LED chips. FIG. 38 illustrates a reflector 103 according to the thirteenth embodiment.

Figure 39:
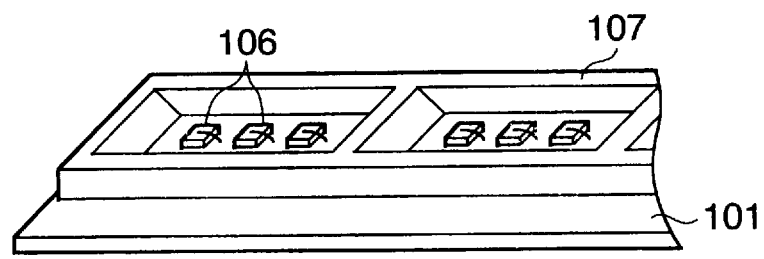

Referring to FIG. 38, LED chips 102 are arranged on an LED board 101 longitudinally thereof. The LED board 101 takes the form of a glass epoxy board. A reflector 103 has upwardly inclined side walls so that the reflector 103 has a larger opening with increasing distance from the LED board. The reflector 103 is mounted on the LED board 101, isolating adjacent LED chips from one another. The side walls are inclined by approximately 50 degrees with respect to the surface of the glass epoxy board. FIG. 39 illustrates another reflector 107 which separates groups of three adjacent LED chips 106 one group from another. The reflectors 103 and 107 serve to reduce interference between the light emitted from the respective groups so as to render the resultant distribution of light more uniform.

Fourteenth embodiment

A fourteenth embodiment is also directed to the specific construction of a reflector.

Figure 40:
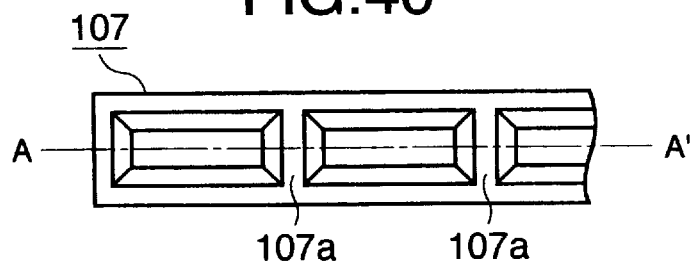
FIGS. 40–47 illustrate a fourteenth embodiment.
Figure 41:
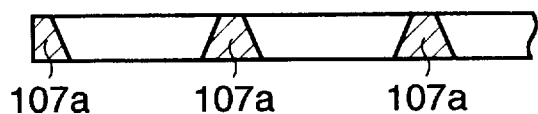
Figure 42:
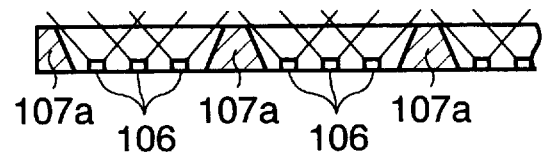

The construction will be described with reference to FIGS. 40–42 and 45–46. FIG. 40 is a top view of the reflector 107 and FIG. 41 is a cross-sectional view taken along the line A–A' of FIG. 40. FIG. 42 is a cross-sectional view when the reflector 107 is mounted on the LED board, showing the bridges 107a that separate groups of three adjacent LED chips 106 from one another.

The bridges 107a may be formed to separate the adjacent LED chips from one another.

The minimum height of the bridge 107a is determined depending on the conditions of the resin-molding process of the reflector 107. Referring to FIG. 40, the height of bridges 107a of the reflector 107 is selected to be less than 0.5 mm. In the fourteenth embodiment, the height is 0.4 mm.

Figure 43:
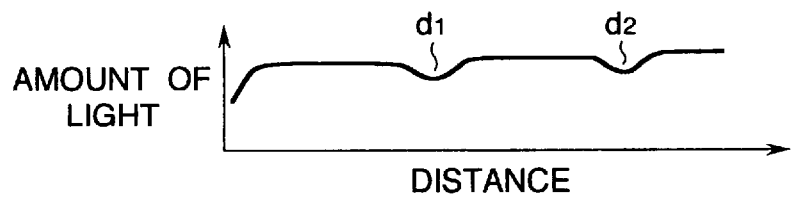
Figure 44:
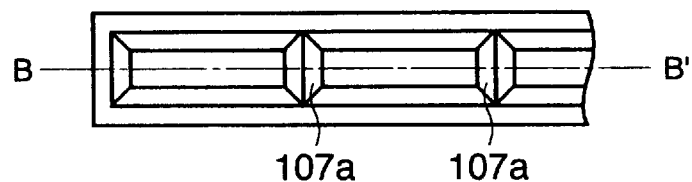
Figure 45:
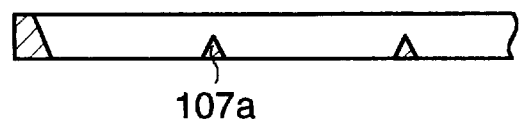
Figure 46:
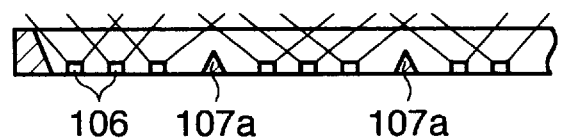
Figure 47:
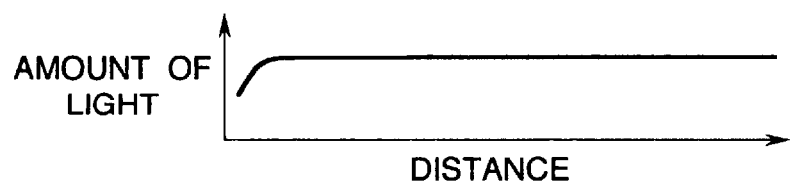

Higher bridges 107a block some of the light emitted from the LED chips 106 located adjacent the bridges 107a, so that the LED chips located near the bridge 107a result in dips d1 and d2 in the overall distribution of light as shown in FIG. 43. This can be improved by decreasing the height of the bridge 107a as shown in FIGS. 44 and 45, so that a large amount of light is not blocked by the bridges 107a. FIG. 44 is a top view of the reflector with shorter height and FIG. 45 is a cross-sectional view taken along the line B–B'. Thus, the light emitted from adjacent LED chips is uniformly combined as shown in FIG. 46, providing a uniform overall distribution of light as shown in FIG. 47.

Fifteenth embodiment

A fifteenth embodiment is directed to a mounting construction of a reflector.

Figure 48:
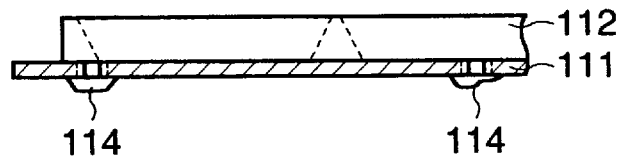
FIGS. 48–51 illustrate a fifteenth embodiment.

FIG. 48 shows a reflector 112 of the invention fixedly mounted to an LED board 111 in a conventional manner, where the legs of the reflector 112 are deformed by melting by heat at a portion 114. The LED board 111 is in the form of a glass epoxy board.

A problem with the conventional manner of fixing the reflector to the LED board 111 is that the reflector 112 may be raised slightly from the LED board 111 when the legs are melted by pressing a heater from the reverse side of the LED board 111. In addition, an exclusive assembly jig is needed to melt the ends of the legs.

Figure 49:
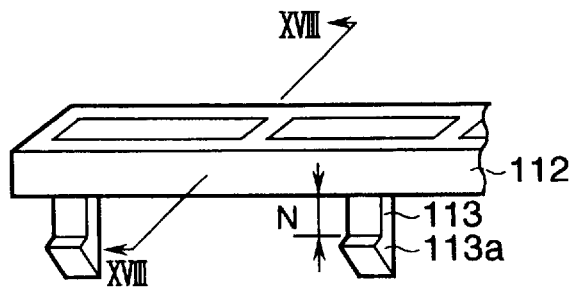
Figure 50:
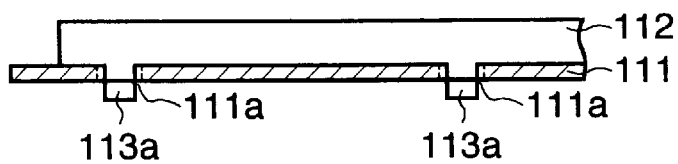

FIG. 49 is an enlarged fragmentary perspective view, illustrating a fifteenth embodiment. Referring to FIG. 49, the legs 113 are L-shaped and are formed in one piece construction with the reflector 112. The length N of the leg 113 is selected in accordance with the thickness of the LED 111, i.e., the effective length N of the legs 113 is the same as the thickness of the LED board 111. The reflector 112 is fixedly mounted by inserting the legs 113 through openings 111a formed in the LED board 111 as shown in FIG. 50.

Figure 51:
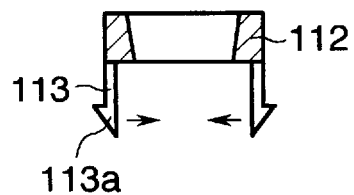

FIG. 51 is a cross-sectional view taken along lines XVIII—XVIII in FIG. 49.

When the legs 113 are pushed into the openings, the legs 113 are somewhat resiliently deformed yieldably toward each other as depicted by arrows shown in FIG. 51 and the hooks 113a snap out of the openings 111a after the hooks completely pass through the openings 111a.

The leg 113 having the hook 113a in one piece construction allows press-fit assembly operation, eliminating the use of an exclusive assembly jig. This construction prevents the reflector from being raised from the LED board 111. The hooks 113a may be a variety of shapes such as those shown in FIGS. 52–55.

Figure 52:
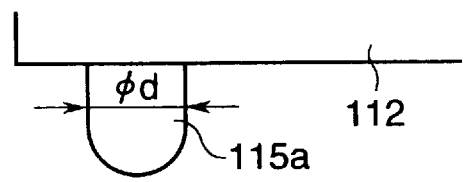
FIGS. 52–55 illustrate shapes of mounting legs of the fifteenth embodiment.
Figure 53:
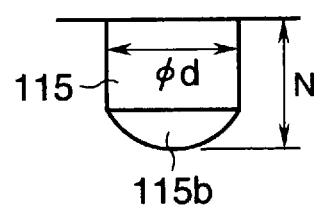
Figure 54:
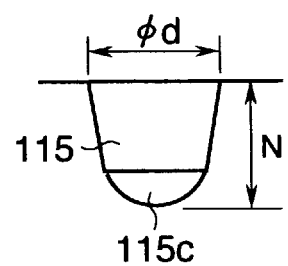
Figure 55:
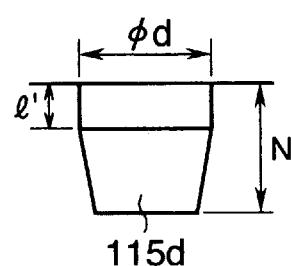

FIG. 52 shows a cylindrical leg 115a with a round end, FIG. 53 shows a cylindrical leg 115 with a partially spherical end 115b, FIG. 54 shows a leg in the form of a truncated cone having a partially spherical end 115c, and FIG. 55 shows a cylindrical leg with a truncated cone 115d. The legs shown in FIGS. 52–55 are press-fitted into holes formed in the LED board.

Sixteenth embodiment

A sixteenth embodiment is directed to a guiding construction for guiding an original onto a glass cover.

The glass cover 122 is laterally held by projections 125 and 127 as shown in 20C.

Figure 56:
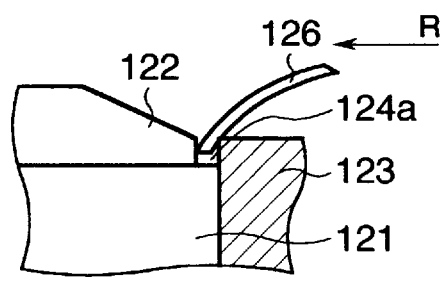
FIGS. 56–59 illustrate a sixteenth embodiment.
Figure 57:
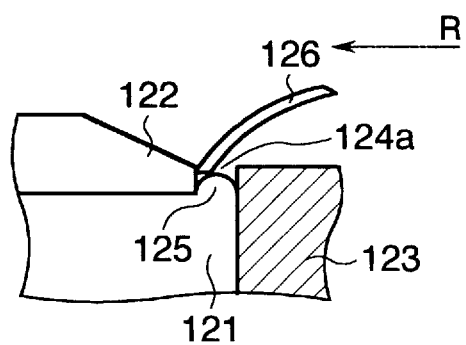

Referring to FIGS. 56 and 57, an original 126 to be read is fed in a direction shown by arrow R. The original 126 is likely to be caught at its front edge by a gap 124a between the glass cover 122 and a case 123, as shown in FIGS. 56 and 57.

Figure 58:
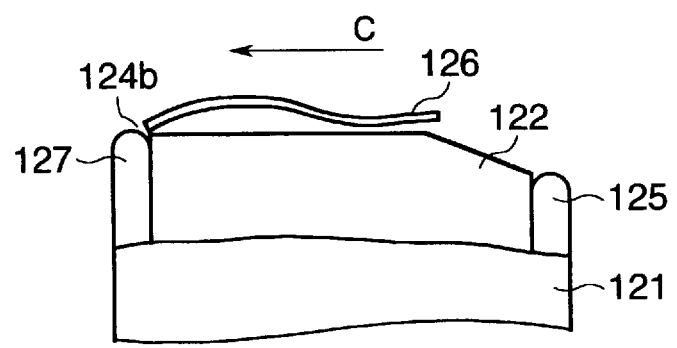

Referring to FIG. 58, as the original 126 travels forward in a direction shown by arrow C on the glass cover 122, the forward end of the original 126 reaches the end of the glass cover 122 and may be caught by a gap 124b before it leaves the glass 122, as shown in FIG. 58.

Figure 59:
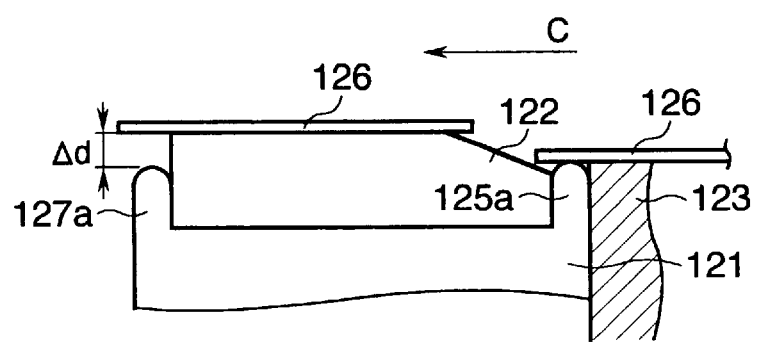

The gaps 124a may be eliminated by providing guides 125a as shown in FIG. 59. The guide 125a has a round upper end and projects upwardly higher than the adjacent surface of the glass cover 122 and is flush with the upper edge of the case 123. When the original 126 is fed, it is smoothly guided by the round upper end of the guide 125a to smoothly ride onto the beveled surface of the glass cover 122.

The gap 124b may be eliminated by providing guides 127a as shown in FIG. 59. The guide 127a has an upper end which is a distance Δd below the top surface of the glass 122, so that the original 126 is smoothly discharged out of the read sensor.

Seventeenth embodiment

Figure 77:
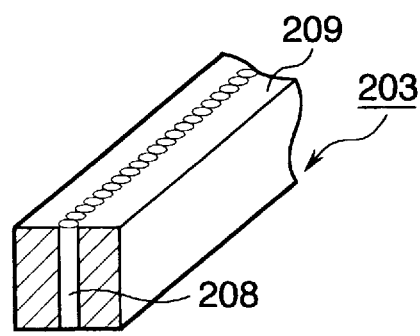
FIG. 77 is a fragmentary perspective view of the SELFOC lens array of FIG. 76.
Figure 78:
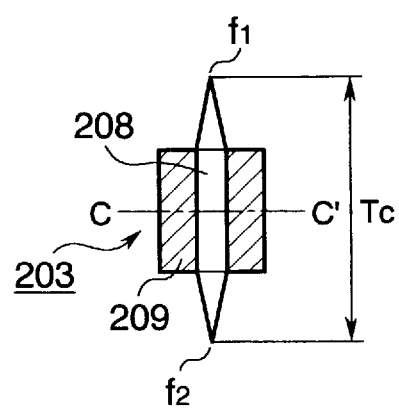
FIG. 78 is a cross-sectional view of a SELFOC lens array of FIG. 76.

A seventeenth embodiment is directed to a manner in which an SLA is fixed to a case of a read sensor. FIGS. 60–63 illustrate the seventeenth embodiment. An SLA 131 is the same construction as the prior art SLA 203 shown in FIGS. 77 and 78. Each of the fibers in the SLA 131 has two focal points; one is on the light incident side thereof and the other is on the light emerging side. The resolution of data read from the original critically varies depending on whether one of the focal points of the SLA is on the original and the other on the light-receiving surfaces of the photodetectors. Poorly focusing on any of the original and light sensors results in poor resolution of the data.

Figure 60:
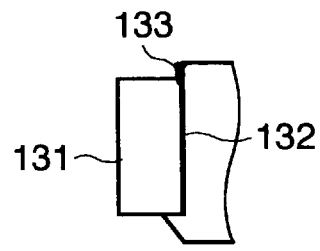
FIGS. 60–63 illustrate the seventeenth embodiment.
Figure 61:
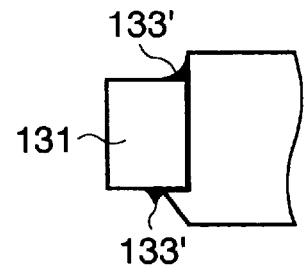

As shown in FIG. 60, the SLA 131 is conventionally fixedly mounted to a wall 132 of a case by applying a resin 133 to the wall 132 of the case 141 and then pressing the SLA 131 against the wall 132 to which the resin 133 is applied. This mounting method presents a problem that when the SLA 131 is pressed onto the wall 132, an excess portion 133' of the resin 133 spreads and the excess resin can reach the light incident ends of the optical fibers as shown in FIG. 61.

Figure 62:
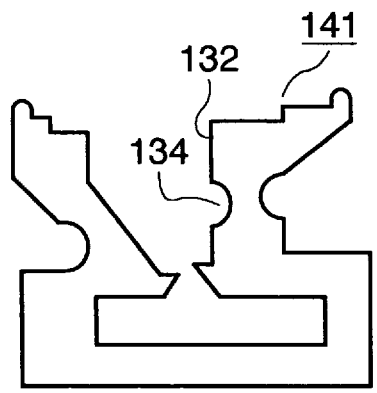

In order to solve this problem, a case 141 is formed with a semi-cylindrical groove 134 in the wall 132 as shown in FIG. 62, the groove 134 having a diameter of about 0.5 mm and extending in a direction perpendicular to the page of FIG. 62.

Figure 63:
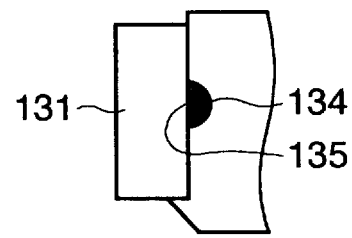

Then, the groove 134 is filled with silicone resin 135 and the SLA 131 is firmly pressed against the wall 132 as shown in FIG. 63. Some of the silicone resin 135 may spread into a gap between the SLA 131 and the wall 132 but will not come out of the gap. The groove 134 may be other shapes such as a rectangular column. While a single groove 134 is formed in the wall 132 shown in FIGS. 62 and 63, a plurality of grooves may be formed for increased adhesion.

Eighteenth embodiment

Figure 64:
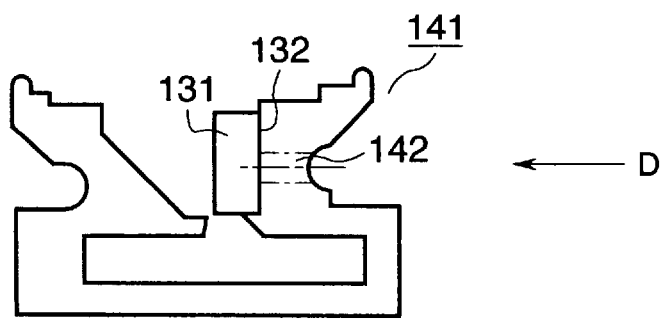
FIG. 64 illustrates an eighteenth embodiment.

FIG. 64 shows an eighteenth embodiment which is directed to a manner in which an SLA 131 is fixed to a case 141. A plurality of laterally extending holes 142 are formed in a case 141 which is made by extruding aluminum. Three holes 142 per 80 mm distance are sufficient.

The holes 142 have a diameter of about 1 mm and the resin is poured into holes 142 from a direction shown by D for securely bonding the SLA 131 to the case 141.

When the SLA 131 is firmly pressed against the wall 132, the excess resin escapes in a direction opposite to the direction D through the holes 142.

Nineteenth embodiment

Figure 65:
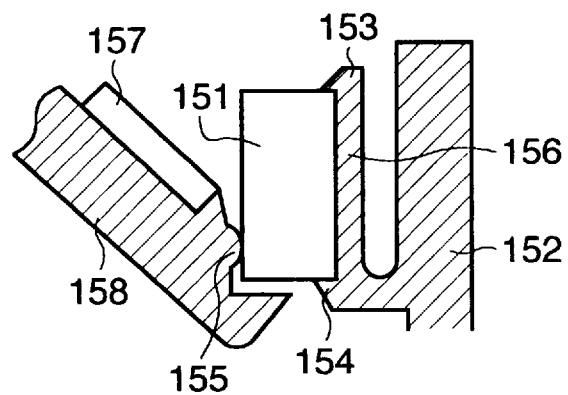
FIGS. 65–66 illustrate a nineteenth embodiment.
Figure 66:
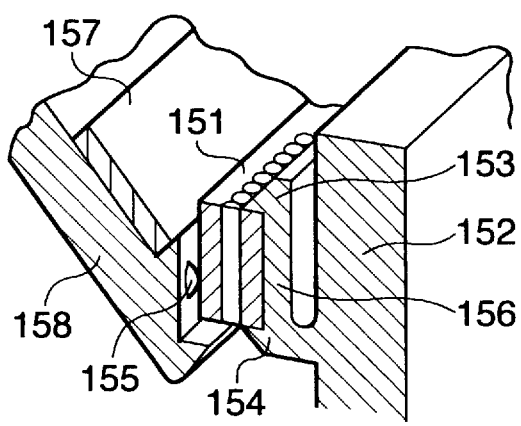

A nineteenth embodiment is directed to another mounting construction of an SLA. FIG. 65 is a cross-sectional side view with a partial sectional view, illustrating a mounting construction where an SLA 151 is mounted to a case 152. FIG. 66 is a perspective cross-sectional view. Referring to FIG. 65, the case 152 has a generally L-shaped holder 156 and an obliquely downwardly extending holder 158 on which an LED board 157 is mounted. The holder 158 is made of a material such as polycarbonate plastics. The holder 158 has hemispherical projections 155 and the L-shaped holder 156 has an upper retaining hook 153 and a lower retaining hook 154. The upper and lower retaining hooks 153 and 154 are spaced apart just enough for the SLA 151 to snugly fit therebetween. When the SLA 151 is inserted between the hemispherical projections 155 and L-shaped holder 156, the hemispherical projections 155 are somewhat yieldably deformed, pressing the SLA 151 against the L-shaped holder 156 to firmly hold the SLA 151.

Twentieth embodiment

A twentieth embodiment is directed to a mounting construction of an LED board 163 in the form of a glass epoxy board.

Figure 67:
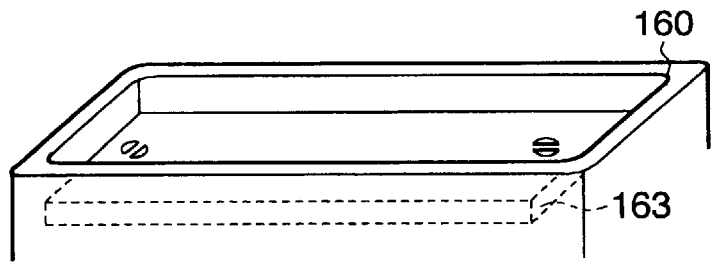
FIGS. 67–73 illustrate a twentieth embodiment.
Figure 68:
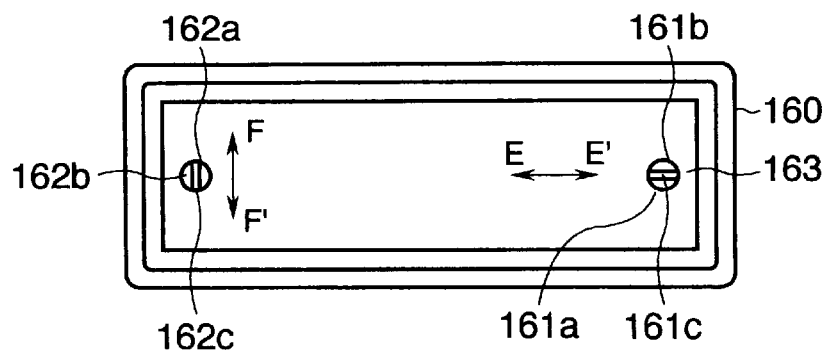

FIG. 67 is a perspective view of a case to which the LED board 163 is assembled and FIG. 68 is a top view of the construction in FIG. 67. Referring to FIG. 67, a case 160 is formed with two pairs 161 and 162 of mounting projections. Each pair 161 or 162 includes two mounting projections 161a–161b or 162a–162b arranged back-to-back with a slot 161c or 162c therebetween. The slot 161c extends in a direction shown by arrows E–E' while the slot 162c extends in a direction shown by arrows F–F' perpendicular to the direction shown by arrow E–E'. Each pair is generally cylindrical and projects upward from the bottom of the case 160. The mounting projections 162a and 162b each have a hook 162d which is formed at its free end and projects diametrically outwardly.

Figure 69:
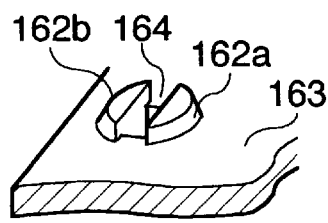
Figure 70:
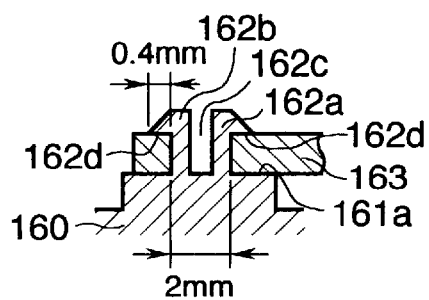
Figure 71:
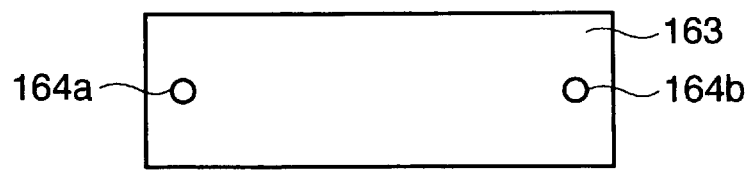

Referring to FIGS. 69 and 70, the LED board 163 has LED chips, not shown, mounted thereon and two round holes 164a and 164b formed therein. When assembling, the LED board 163 is first held horizontally above the case 160 and then lowered so that the pairs 162 and 161 extend into the round holes 164a and 164b, respectively. As the pair 162 extends into the round hole 164a, the mounting projections 162a and 162b arranged back-to-back are yieldably deformed toward each other. Likewise, as the pair 161 extends into the round hole 164b, the mounting projections 161a and 161b arranged back-to-back are yieldably deformed toward each other. It is to be noted that the two pairs 161 and 162 of mounting projections deform in directions perpendicular to each other. Immediately after the hooks 162d pass completely through the holes 164a and 164b, the hooks 162d snap out of the holes 164a and 164b, regaining their original positions to firmly hold the LED board 163 between the hooks 162d and the bottom surface 161a of the case 160.

Upon assembling the LED board 163 to the case 160, the LED board 163 is securely held both horizontally and vertically. The round holes 164a and 164b formed in the LED board 163 have a diameter of 2 mm and the hooks 162d project 0.4 mm diametrically outwardly to engage the LED board 163.

Figure 72:
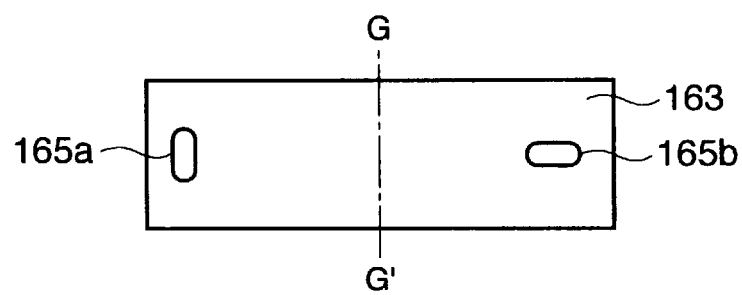
Figure 73:
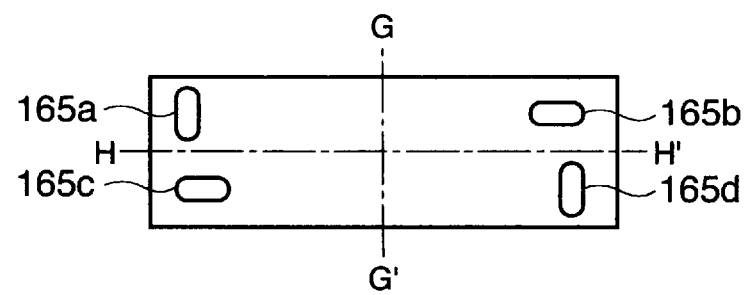

The LED board 163 may be formed with elongated holes 165a and 165b as shown in FIG. 72 in place of the round holes 164a and 164b. The elongated holes 165a and 165b are 2 mm in diameter and 5 mm in length, and extend perpendicular to each other, the centers of the holes being symmetrical about the center line G–G' of the LED board 163. Four elongated holes instead of two holes may be arranged as shown in FIG. 73, the holes 165a–165b and the holes 165c–165d being symmetrical about the center line G–G', respectively, while the holes 165a and 165c and the holes 165b and 165d being symmetrical about the center line H–H'. A larger number of elongated holes may of course be arranged in order to more securely mount the LED board 163.

It is to be noted that the pairs 161 and 162 of mounting projections 161a–161b and 162a–162b prevent the LED board 163 from moving in the direction perpendicular to the direction in which the elongated holes extend but does not prevent it from moving in the direction in which the elongated holes extend. Therefore, the slots 161c and 162c are formed to extend in the same direction as the elongated holes, so that the pairs of mounting projections resiliently push the LED board 163 in a direction perpendicular to the direction in which the elongated holes 165a–165d extend, thereby securely holding the LED board 163 once the LED board 163 is assembled to the case 160.

Twenty-first embodiment

Figure 74:
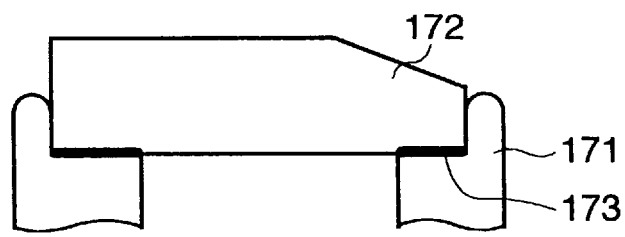
FIGS. 74–75 illustrate a twenty-first embodiment.

A twenty-first embodiment is directed to a mounting construction of a glass cover 172 on which an original to be read is placed. Referring to FIG. 74, the glass cover 172 is fixed to the case 171 by a silicone resin 173. The silicone resin 173 was conventionally applied to flat surfaces of the case 171. Thus, the layer of the silicone resin 173 is very thin after the glass 172 is bonded to the case 171, resulting in decreased adhesion. In addition, the thin layer of the silicone resin 173 can cause some gaps to develop between the glass 172 and the case 171 through which dust and moisture may enter, resulting in denatured silicone resin.

Figure 75:
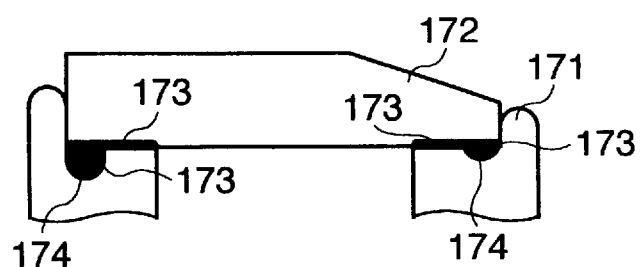
Figure 76:
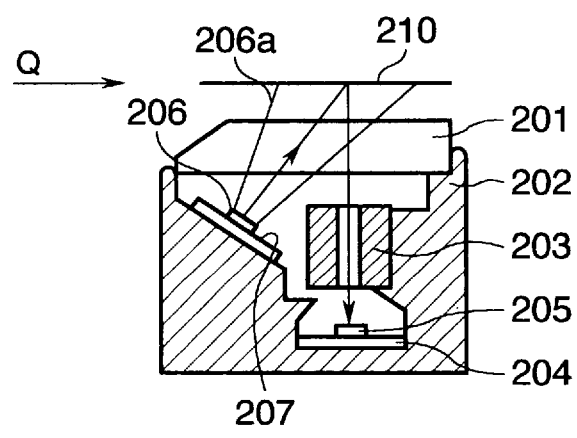
FIG. 76 is a cross-sectional view of a conventional optical sensor.

In the twenty-first embodiment, as shown in FIG. 75, the case 171 is formed with grooves 174 therein, which holds an adhesive therein. The grooves are 0.5 to 1 mm wide and 0.5 mm deep. The groove 174 holds a sufficient amount of adhesive between the case 171 and glass cover 172, providing sufficient adhesion as well as eliminating the gap which would develop if the layer of the adhesive 173 is too thin. In other words, the groove 174 offers some sealing effect.

The invention being thus described, it will be obvious that the described invention may be varied in many ways. Such variations are not to be regarded as a departure from the spirit and scope of the invention, and all such modifications as would be obvious to one skilled in the art are intended to be included within the scope of the following claims.

What is claimed is:

1. An optical read sensor, comprising:
    a circuit board having light-emitting elements mounted thereon, said light-emitting elements emitting light;

a transparent cover having a surface on which an original is placed;

light-receiving elements, receiving light reflected by the original through said transparent cover; and a lens array formed of a plurality of optical fibers arranged in parallel in a row, each of the optical fibers having an optical axis with a first focal point on a light incidence side and second focal point on a light exiting side, said lens array guiding the light reflected by the original to said light-receiving elements;

wherein the light emitted from said light-emitting elements has a substantially uniform distribution of intensity in a volume parallel to the surface of the transparent cover after the light has passed through the transparent cover, the volume being within a predetermined range of distance from the transparent cover, the optical axis passing through the volume.

2. The optical read sensor according to claim 1, further including a case to which said light guide is fixed by an adhesive, said case having a groove formed therein so that the adhesive is held in said groove between said light guide and said case when said light guide is fixed to said case.

3. The optical read sensor according to claim 1, further including a case formed with at least one through-hole therein so that an adhesive is introduced into the through-hole to apply the adhesive to an interface between said light guide and said case when said light guide is attached to said case.

4. The optical read sensor according to claim 1, further including a case for holding said light guide, said case having:

a wall against which said light guide is pressed;

an upper hook and lower hook between which said light guide is held, said upper and lower hooks projecting from said wall; and a projection projecting toward said wall so that said light guide is held by said projection against said wall when said light guide is assembled to said case between said upper and lower hooks.

5. The optical read sensor according to claim 1, wherein said transparent cover is fixedly mounted to said case by an adhesive, said case being formed with a groove so that the adhesive is held in said groove between said transparent cover and said case.

6. The optical read sensor according to claim 1, wherein said circuit board is formed with at least two second mounting holes, and said optical read sensor further includes a case including at least two pairs of mounting projections, each of said mounting projections having a hook projecting laterally thereof at a free end thereof, said mounting projections of each pair being arranged in a mirror relation with a gap therebetween so that said hooks project outwardly of said pair;

wherein said mounting projections resiliently and yieldably deform toward each other when said mounting projections are pushed into said second mounting holes formed in said circuit board, said mounting projections of one pair deform in directions perpendicular to directions in which said mounting projections of the other pair deform, and said mounting projections regain positions thereof after said hooks extend completely through said second mounting holes so that said circuit board is firmly caught between said hooks and said case.

7. The optical read sensor according to claim 6, wherein said second mounting holes are elongated, and said pairs of mounting projections deform in directions perpendicular to directions in which said second mounting holes are elongated.

8. The optical read sensor according to claim 1, wherein each of said light-receiving elements is formed on a semiconductor substrate and includes:

light-receiving areas and a light-blocking area surrounding said light-receiving areas;

an interlayer dielectric formed in said light-blocking area;

through-holes formed in said interlayer dielectric layer; and an aluminum layer formed on said interlayer dielectric, said aluminum layer filling said through-holes and blocking light incident thereupon.

9. The optical read sensor according to claim 8, further including a carrier-absorbing electrode formed between said light-receiving areas.

10. The optical read sensor according to claim 8, further including a polysilicon layer formed to surround said through-holes.

11. The optical read sensor according to claim 1, wherein each of said light-receiving elements is formed on a semiconductor substrate and includes:

light-receiving areas and a light-blocking area surrounding said light-receiving areas;

a first interlayer dielectric formed in said light-blocking area;

a plurality of contact-holes formed in said interlayer dielectric;

a first aluminum layer formed on said first interlayer dielectric and for blocking light incident thereon, said first aluminum layer filling said contact-holes;

a second interlayer dielectric surrounding said light-receiving areas;

through-holes formed in said second interlayer dielectric layer; and a second aluminum layer formed on said second interlayer dielectric, said second aluminum layer filling said through-holes and blocking light incident thereupon;

wherein said contact-hole and said through-holes are arranged one alternatively with the other.

12. The optical read sensor according to claim 11, further including a polysilicon layer formed to surround said through-holes and said contact-holes.

13. The optical read sensor according to claim 11, further including a carrier-absorbing electrode formed between said light-receiving areas.

14. The optical read sensor according to claim 1, wherein said circuit board has a first side surface and a second side surface opposing said first side surface, said first side surface having bonding pads formed thereon and said second side surface having wire patterns formed thereon, said bonding pads extending over substantially the entirety of said first surface and said wire patterns extending substantially over the entirety of said second surface;

wherein said circuit board further has light-emitting elements mounted on corresponding ones of said bonding pads and current-limiting resistors mounted on said wire patterns, said resistors limit currents through said light-emitting elements.

15. The optical read sensor according to claim 14, wherein said bonding pads are arranged with a first gap therebetween and said wire patterns are arranged with a second gap therebetween, said bonding pads and wire patterns being arranged in a staggered relation so that said first and second gaps do not overlap each other.

16. The optical read sensor according to claim 14, wherein each of said bonding pads has a die-bonding pad and a wire bonding pad electrically continuous with said die-bonding pad via a narrow connection.

17. The optical read sensor according to claim 14, wherein said bonding pads and said wire patterns are formed on said circuit board by gold plating.

18. The optical read sensor according to claim 14, wherein said circuit board is provided with a lens which converts the light emitted from said light-emitting elements into substantially parallel light.

19. The optical read sensor according to claim 18, wherein said substantially parallel light illuminates the original within a predetermined distance above said cover.

20. The optical read sensor according to claim 14, wherein said circuit board includes a reflector mounted thereon having walls which surround at least one of said light-emitting elements, said walls having reflecting surfaces which reflect the light emitted from said light emitting-elements so that the original is illuminated by a substantially the same amount of light thereacross.

21. The optical read sensor according to claim 20, wherein said reflector further includes at least a pair of mounting legs having hooks projecting in opposite directions, and said circuit board further includes at least two first mounting holes into which said mounting legs are received when said reflector is assembled to said circuit board, said mounting legs resiliently yieldably deforming when said mounting legs are pushed into said first mounting holes, and said mounting legs regaining original positions thereof after said hooks pass completely through said first mounting holes so that said circuit board is firmly caught between said hooks and said reflector.

22. The optical read sensor according to claim 20, wherein said walls define a plurality of openings through which a predetermined number of said light-emitting elements emit light, said reflecting surfaces being inclined with respect to said first side surface of said circuit board so that said openings are progressively larger with increasing distance from the circuit board.

23. The optical read sensor according to claim 22, wherein said walls bounding adjacent openings are lower in height than the other walls.

* * * * *